United States Patent
Kruiskamp et al.

(10) Patent No.: US 7,199,585 B2
(45) Date of Patent: Apr. 3, 2007

(54) METHOD FOR SHIMMING A MAIN MAGNETIC FIELD IN MAGNETIC RESONANCE

(75) Inventors: Marinus Johan Kruiskamp, Eindhoven (NL); Willem Marten Prins, Eindhoven (NL); Lambertus Johannes Maria Petrus Oosterwaal, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/560,871

(22) PCT Filed: Jun. 15, 2004

(86) PCT No.: PCT/IB2004/050910

§ 371 (c)(1),
(2), (4) Date: Dec. 14, 2005

(87) PCT Pub. No.: WO2004/111671

PCT Pub. Date: Dec. 23, 2004

(65) Prior Publication Data

US 2006/0244450 A1    Nov. 2, 2006

(30) Foreign Application Priority Data

Jun. 19, 2003    (FR) .................................. 03101810

(51) Int. Cl.
G01V 3/00    (2006.01)

(52) U.S. Cl. ...................................... 324/320

(58) Field of Classification Search ................. 324/320
See application file for complete search history.

(56) References Cited

U.S. PATENT DOCUMENTS 5,111,146 A    5/1992    Kuhn .......................... 324/318

(Continued)

FOREIGN PATENT DOCUMENTS

EP    0 547 917 A1    6/1993
JP    10-262948 A    10/1998

OTHER PUBLICATIONS

CT scans of the heart; 2000; Med. Phys.; 27(8)1881-1902.

*Primary Examiner*—Louis M. Arana

(57) ABSTRACT

The invention relates to a method for shimming a main magnetic field in a magnetic resonance device. The method comprises the steps of generating at least one spatially selective radio frequency pulse (RF) for exciting nuclear spin magnetization within a restricted region of the examination volume of the magnetic resonance device, acquiring a magnetic resonance signal (ES) that is sensitive to the homogeneity of the main magnetic field, and applying electric currents (SZ, SX, SY) to a shim coil arrangement of the magnetic resonance device such that the main magnetic field is adjusted in accordance to the properties of the acquired magnetic resonance signal (ES). In order to provide a shimming method, in which it is avoided that the shape or size of the selected volume is influenced by the adjustment of the magnetic field distribution generated by the shim coils, the invention proposes that the electric currents (SZ, SX, SY) applied to the shim coil arrangement are at least partially switched off during the generation of the spatially selective radio frequency pulse (RF) and switched on during the acquisition of the magnetic resonance signal (ES).

5 Claims, 2 Drawing Sheets

U.S. PATENT DOCUMENTS

| | | | |
|---|---|---|---|
| 5,121,060 A | 6/1992 | Doddrell et al. | 324/320 |
| 5,250,902 A * | 10/1993 | Williams et al. | 324/320 |
| 5,490,509 A | 2/1996 | Carlson et al. | 128/653.2 |
| 6,023,167 A | 2/2000 | DeMeester et al. | 324/318 |
| 6,342,787 B1 | 1/2002 | Petropoulos et al. | 324/320 |
| 6,794,868 B1 * | 9/2004 | Wong et al. | 324/307 |
| 7,034,530 B2 * | 4/2006 | Ahluwalia et al. | 324/309 |

* cited by examiner

METHOD FOR SHIMMING A MAIN MAGNETIC FIELD IN MAGNETIC RESONANCE

The invention relates to a method for shimming a main magnetic field in a magnetic resonance device, the method comprising the following steps:

a) generating at least one spatially selective radio frequency pulse for exciting nuclear spin magnetization within a restricted region of the examination volume of the magnetic resonance device;

b) acquiring a magnetic resonance signal that is sensitive to the homogeneity of the main magnetic field;

c) applying electric currents to a shim coil arrangement of the magnetic resonance device such that the main magnetic field is adjusted in accordance to the properties of the magnetic resonance signal acquired in step b).

Furthermore, the invention relates to a magnetic resonance device for carrying out this method and a computer program for a magnetic resonance device.

Magnetic resonance imaging (MRI) techniques always employ a spatially uniform and temporally constant main magnetic field usually referred to as $B_0$. For the purpose of excitation of nuclear spin magnetization within the examination volume of the magnetic resonance imaging device, a $B_1$ radio frequency field is superimposed on the $B_0$ field at the respective proton resonant frequency. Magnetic resonance devices further comprise a set of gradient coils for the generation of linear gradient magnetic fields by which a spatial encoding of the nuclear spin magnetization is achieved. During the actual MRI imaging procedure pulse sequences consisting of radio frequency and switched gradient magnetic fields are applied to an object (a patient) to generate magnetic resonance signals which are scanned in order to obtain information therefrom and to reconstruct images of the object. The properties of the applied pulse sequence determines completely the characteristics of the reconstructed images, such as location and orientation in the object, dimensions, resolution, signal-to-noise ratio, contrast, sensitivity for movements, etcetera. An operator of an MRI device has to choose the appropriate sequence and has to adjust and optimize its parameters for the respective application.

Ideally, the main magnetic field is homogeneous (i.e. uniform) throughout the examination volume of the magnetic resonance imaging device. In practical applications however, inhomogeneities are present in the main magnetic field which adversely affect the quality of the obtained images. Typical magnetic resonance imaging devices therefore comprise shimming means for improving and controlling the homogeneity of the main magnetic field. Passive and active shimming techniques are known in the art. Passive techniques usually employ an arrangement of shim steel elements for minimizing static magnetic field inhomogeneities. These techniques, which are disadvantageously not suited to handle field inhomogeneities on a scan-by-scan basis, are mainly used to compensate for built-in tolerances of the main magnet of the magnetic resonance device and for static environmental side effects.

An arrangement of shim coils is usually employed with known magnetic resonance imaging devices for the purpose of active shimming. Electric currents may be applied to the shim coils in order to generate additional magnetic fields by which inhomogeneities in the main magnetic field are compensated for. In the design of known shim coil arrangements the magnetic field distribution generated by the electric currents applied to the shim coils may be described as a linear combination of certain spherical harmonics. The first term in such a representation would be the zero term representing a homogeneous, uniform component. Then there are three linear gradient spherical harmonics, five quadratic components, seven cubic components and so on. Linear and higher order spherical harmonics may be suppressed to the greatest possible degree by means of the electric currents applied to the shim coil arrangement so as to leave only the desired zero term of the main magnetic field distribution. With known shim coil arrangements there are commonly first order and second order and sometimes even third order corrections implemented to compensate for the corresponding terms of the main magnetic field. Advantageously, the active shimming can be adjusted from scan to scan, for example to compensate for inhomogeneities caused by the specific susceptibility and shape of the patient being imaged. There are a number of methods known to determine the electric currents to be applied to the shim coil arrangement such that the uniformity of the main magnetic field is optimized. Usually magnetic resonance signals are acquired during the shimming procedure, and the electric currents are incrementally adjusted until the properties of the magnetic resonance signals are such that the homogeneity of the main magnetic field can be considered optimal. The magnetic resonance signals are sensitive to field homogeneity in that for example signal amplitude and spectral width strongly depend on the spatial distribution of the main magnetic field. Other methods are known in which for example image distortions of known objects are evaluated to compute the appropriate shim currents.

A drawback of known shimming methods is that the specific shape and size of the volume selected by means of one or more spatially selective radio frequency pulses is inevitably influenced by the magnetic field distribution of the shim coil arrangement being adjusted during the shimming procedure. This is because the linear gradient magnetic fields generated by the shim coils interfere with slice-selection gradients having the same direction. Changes in the size of the selected volume result in changes of the amplitudes of the acquired magnetic resonance signals. These changes may then erroneously be interpreted as being caused by an increase or decrease of the homogeneity of the main magnetic field. Thus, known shimming procedures, which try to optimize the homogeneity of the main magnetic field by maximizing the amplitude of the acquired signal, are easily confused as an increase of the signal amplitude due to an increase of the size of the selected volume can not be distinguished from an increase of signal amplitude due to an improved field homogeneity.

In present magnetic resonance imaging devices operating at low main magnetic fields of about 1,5 Tesla or less, the typical strength of the gradient magnetic fields required for shimming is about 0,2% of the strength of the imaging gradients. An adjustment of the shimming gradients will thus lead to a relative change of the size of the selected volume of about 0,6%. At higher fields of 3 Tesla or more, the effect is significantly stronger, since the strength of the shimming gradients may be up to 4% of the strength of the slice selection gradients. Relative volume changes of the order of 12% may easily occur during the shimming procedure in such cases.

Therefore it is readily appreciated that there is a need for an improved method for shimming a main magnetic field in a magnetic resonance imaging device. It is consequently the primary object of the present invention to provide a shimming method in which it is avoided that the shape or size of the selected volume is influenced by the adjustment of the magnetic field distribution generated by the shim coils.

In accordance with the present invention, a method of the type specified above is disclosed, wherein the electrical currents applied to the shim coil arrangement are at least partially switched off during the generation of the spatially selective radio frequency pulse in step a) and switched on during the acquisition of the magnetic resonance signal in step b).

The invention is based on the finding that the influence of the adjustment of the shim gradients on the size and shape of the selected volume can be counteracted by switching off the power supply of the relevant shim gradients during volume selection. Changes of the size of the selected volume and thus confusing increase or decrease of signal amplitude during shimming are effectively avoided in this way.

It turns out that the method of the invention is particularly useful and advantageous in magnetic resonance methods relating to spectroscopy and to spectroscopic imaging as well as to three-dimensional image acquisition. In these methods, effective control of the homogeneity of the main magnetic field is of high importance.

With the method of the invention it is advantageous to repeat steps a) to c) such that the homogeneity of the main magnetic field is optimized iteratively. The procedure may be continued until a further adjustment of the electric currents applied to the shim coil arrangement does not have any further effect on the acquired signal. It is also possible to stop the procedure as soon as particular properties of the acquired signal, as for example its amplitude or its spectral width, have reached a desired value.

A linear gradient magnetic field may be temporarily superimposed upon the radio frequency pulse in step a) for the purpose of slice selection by means of an appropriate gradient coil arrangement of the magnetic resonance device. The electric currents applied to the shim coil arrangement in step c) generate linear gradient magnetic fields and possibly higher order field components within the examination volume of the magnetic resonance device such that it is advantageously possible to switch off only those currents of the shim coil arrangement during the generation of the spatially selective radio frequency pulse in step a) which generate linear gradient magnetic fields in the direction of the respective slice-selection gradient. Since the slice selection gradients are in most cases generated either in the x-, y-, or z-direction, it is easily possible to coordinate the switching-off of the electric currents applied to the shim coils with the generation of the slice-selective radio frequency pulse in step a).

According to the invention, the main magnetic field may be adjusted in step c) such that the amplitude of the acquired magnetic resonance signal is maximized and/or the spectral width of the magnetic resonance signal is minimized. The homogeneity of the main magnetic field can be controlled in this way by simply aiming at a maximum signal and/or a minimum spectral width, wherein it is guaranteed that the achieved uniformity of the main magnetic field is not influenced by the effective volume being selected in step a).

It is easily possible to incorporate the method of the present invention in a dedicated device for magnetic resonance imaging of an object placed in a stationary and substantially homogeneous main magnetic field. Such an MRI scanner comprises a preferably cryogenic main magnetic coil for establishing the main magnetic field, a shim coil arrangement for compensating for inhomogeneities of the main magnetic field, gradient coils for generating magnetic field gradients superimposed upon the main magnetic field, a radio frequency antenna for radiating radio frequency pulses towards the object, control means for controlling electric currents applied to the shim coil arrangement and for controlling the generation of the magnetic field gradients and the radio frequency pulses, receiving means for receiving and sampling magnetic resonance signals generated by sequences of radio frequency pulses and magnetic field gradient pulses, and reconstruction means for forming an image from the signal samples. The control means, which is usually a microcomputer with a memory and a program control, comprises a programming with a description of a shimming procedure according to the above-described method of the invention.

A computer program adapted for carrying out the shimming procedure of the invention can advantageously be implemented on any common computer hardware, which is presently in clinical use for the control of MRI scanners. The computer program can be provided on suitable data carriers, such as CD-ROM or diskette. Alternatively, it can also be downloaded by a user from an internet server.

The following drawings disclose preferred embodiments of the present invention. It should be understood, however, that the drawings are designed for the purpose of illustration only and not as a definition of the limits of the invention.

In the drawings

Figure 1:
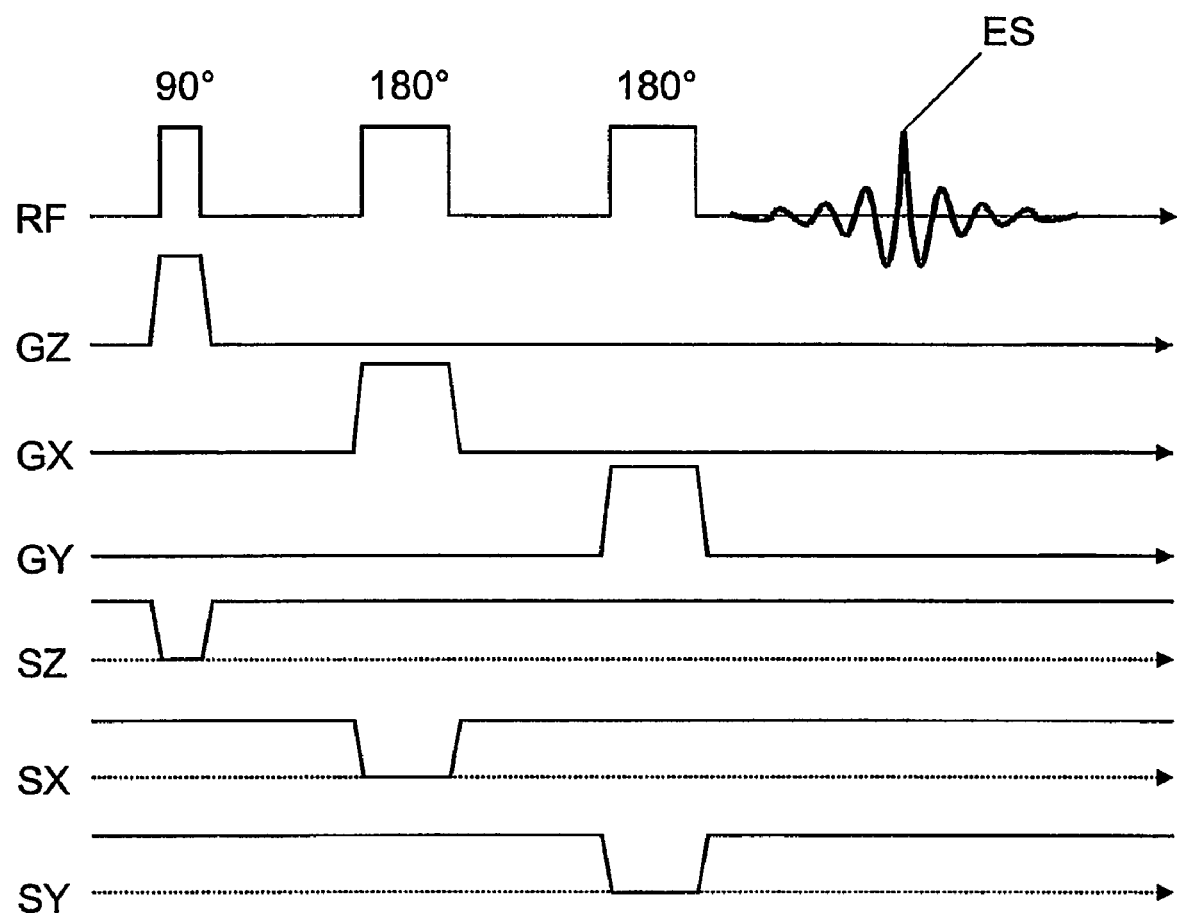
FIG. 1 shows a diagram of the shimming procedure in accordance with the invention.

With reference to FIG. 1, the shimming procedure of the invention comprises the generation of a sequence of radio frequency pulses RF beginning with a 90° excitation pulse followed by two 180° refocusing pulses in temporal succession. Spatial selectivity is achieved by appropriate switching of gradient magnetic fields GZ, GX, and GY in the three perpendicular z-, x-, and y-directions in space. The shown sequence of radio frequency pulses RF and slice selection gradients GZ, GX, and GY excites nuclear spin magnetization within a spatially restricted three-dimensional volume. This magnetization contributes to a magnetic resonance echo signal ES acquired after the last of the depicted 180° radio frequency pulses. In the figure, the temporal behavior of electric currents applied to a shim coil arrangement of the employed magnetic resonance apparatus is illustrated by SZ, SX, and SY. SZ, SX, and SY represent the strength of linear shim gradients in the z-, x-, and y-directions, respectively. The shim gradients SZ, SX, and SY are adjusted in accordance to the amplitude and spectral width of the echo signal ES while repeating the depicted sequence for several times. The homogeneity of the main magnetic field is considered optimum when the amplitude of the signal ES is at a maximum and the spectral width of the signal ES, which can be determined for example by means of a simple Fourier transformation, is at a minimum. As can further be seen in the figure, the shim gradients SZ, SX, and SY are switched off during the generation of the respective radio frequency pulses RF in accordance with the invention such that they do not interfere with the slice selection gradients GZ, GX, and GY, respectively. During the acquisition of the echo signal ES, all shim gradients SZ, SX, and SY are switched on, thus enabling the observation of the effect the adjustment of the shim currents has on field homogeneity.

Figure 2:
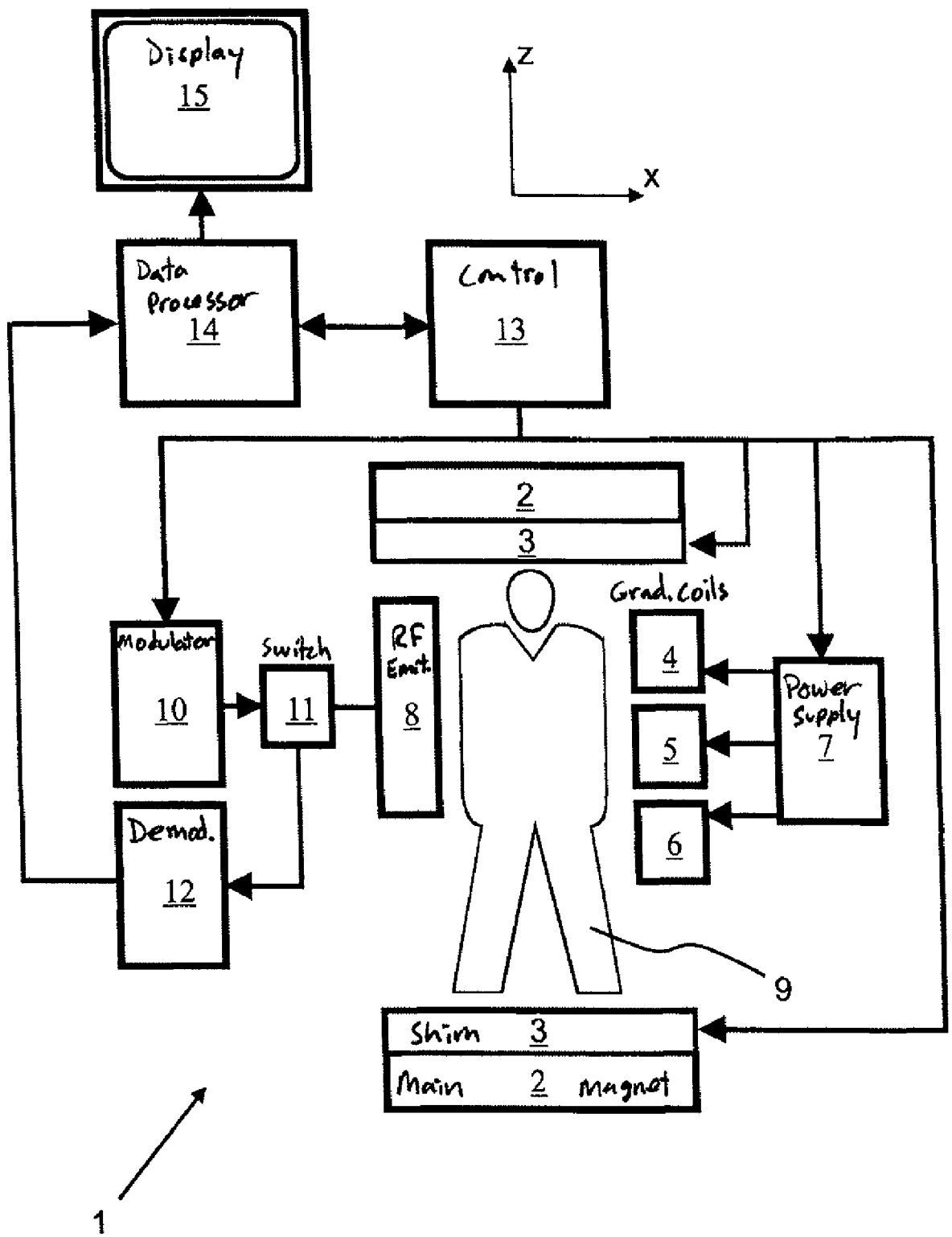
FIG. 2 shows an embodiment of an MRI scanner of the invention.

In FIG. 2 a magnetic resonance imaging device 1 is diagrammatically shown. The apparatus 1 comprises a set of main magnetic coils 2 for generating a stationary and homogeneous main magnetic field. Incorporated into the main magnet is a shim coil arrangement 3 for compensating for inhomogeneities of the main magnetic field. Provision is made for three sets of gradient coils 4, 5 and 6 for superimposing additional magnetic fields with controllable strength and having a gradient in a selected direction. Conventionally, the direction of the main magnetic field is labelled the z-direction, the two directions perpendicular thereto the x- and y-directions. The gradient coils are energized via a power supply 7. The apparatus 1 further comprises a radiation emitter 8, an antenna or coil, for emitting radio frequency pulses to a body 9, the radiation emitter 8 being coupled to a modulator 10 for generating and modulating the radio frequency pulses. Also provided is a receiver for receiving the magnetic resonance signals, the receiver can be identical to the emitter 8 or be separate. If the emitter and receiver are physically the same antenna or coil as shown in FIG. 2, a send-receive switch 11 is arranged to separate the received signals from the pulses to be emitted. The received magnetic resonance signals are input to a demodulator 12. The shim coil arrangement 3, the modulator 10, the emitter 8 and the power supply 7 for the gradient coils 4, 5 and 6 are controlled by a control system 13 to generate radio frequency and gradient magnetic field pulses and to adjust the electric currents applied to the shim coils in accordance with the above-described shimming procedure. The control system is usually a microcomputer with a memory and a program control. For the practical implementation of the invention it comprises a programming with a description of a shimming procedure according to the above-described method. The demodulator 12 is coupled to a data processing unit 14, for example a computer, for transformation of the received magnetic resonance signals into an image that can be made visible, for example, on a visual display unit 15.

The invention claimed is:

1. Method for shimming a main magnetic field in a magnetic resonance device, the method comprising the following steps:
  a) generating at least one spatially selective radio frequency pulse (RF) for exciting nuclear spin magnetization within a restricted region of the examination volume of the magnetic resonance device;
  b) acquiring a magnetic resonance signal that is sensitive to the homogeneity of the main magnetic field;
  c) applying electric currents to a shim coil arrangement of the magnetic resonance device such that the main magnetic field is adjusted in accordance to the properties of the magnetic resonance signal acquired in step b); characterized in that the electric currents applied to the shim coil arrangement are at least partially switched off during the generation of the spatially selective radio frequency pulse in step a) and switched on during the acquisition of the magnetic resonance signal in step b) wherein steps a) to c) are repeated such that the homogeneity of the main magnetic field is optimized iteratively.

2. Method according to claim 1, wherein a linear gradient magnetic field is temporarily superimposed upon the radio frequency pulse in step a) for the purpose of slice selection by means of a gradient coil arrangement of the magnetic resonance device.

3. Method according to claim 2, wherein the electrical currents applied to the shim coil arrangement in step c) generate linear gradient magnetic fields within the examination volume of the magnetic resonance device.

4. Method according to claim 3, wherein only those currents applied to the shim coil arrangement are switched off during the generation of the spatially selective radio frequency pulse in step a) which generate linear gradient magnetic fields in the direction of the slice-selection gradient superimposed upon the radio frequency pulse.

5. Method according to claim 1, wherein the main magnetic field is adjusted in step c) such that the amplitude of the acquired magnetic resonance signal is maximized and/or the spectral width of the magnetic resonance signal is minimized.

* * * * *